(12) United States Patent
Bowler et al.

(10) Patent No.: US 8,139,957 B2
(45) Date of Patent: Mar. 20, 2012

(54) HIGH SENSITIVITY OPTICAL RECEIVER EMPLOYING A HIGH GAIN AMPLIFIER AND AN EQUALIZING CIRCUIT

(75) Inventors: David B. Bowler, Acton, MA (US); Francis J. Calabresi, Harvard, MA (US); Jason G. Luk, Woburn, MA (US)

(73) Assignee: General Instrument Corporation, Horsham, PA (US)

( * ) Notice: Subject to any disclaimer, the term of this patent is extended or adjusted under 35 U.S.C. 154(b) by 845 days.

(21) Appl. No.: 12/145,239

(22) Filed: Jun. 24, 2008

(65) Prior Publication Data

US 2009/0315626 A1 Dec. 24, 2009

(51) Int. Cl.
*H04B 10/06* (2006.01)

(52) U.S. Cl. ........ 398/202; 398/208; 398/209; 398/135; 398/136; 385/89; 385/90; 385/92; 385/93; 250/214 A; 250/214 AG; 250/214 R; 250/214 LA; 330/59; 330/308; 330/304; 330/260

(58) Field of Classification Search ............ 398/37, 398/38, 202–204, 208–210, 213, 214, 135, 398/136, 137, 138, 139, 128, 130, 164, 158, 398/159; 385/88, 89, 90, 92, 93; 250/214 A, 250/214 AG, 214 R, 214 LA; 330/59, 308, 330/304, 260, 253, 257, 258
See application file for complete search history.

(56) References Cited

U.S. PATENT DOCUMENTS

| | | | |
|---|---|---|---|
| 5,311,353 A | 5/1994 | Crawford | |
| 5,343,160 A | 8/1994 | Taylor | |
| 6,593,810 B2 | 7/2003 | Yoon | |
| 6,756,851 B2 | 6/2004 | Mejri | |
| 6,834,165 B2 | 12/2004 | Feng | |
| 7,113,667 B2 | 9/2006 | Welch et al. | |
| 7,135,932 B2 | 11/2006 | Quadir et al. | |
| 7,174,099 B1 | 2/2007 | Chinn et al. | |
| 2002/0140506 A1* | 10/2002 | Kobayashi | 330/85 |
| 2003/0020547 A1 | 1/2003 | Feng | |
| 2003/0178552 A1 | 9/2003 | Hofmeister et al. | |
| 2004/0145799 A1 | 7/2004 | Sedic | |
| 2005/0052246 A1 | 3/2005 | Visocchi | |
| 2005/0133695 A1 | 6/2005 | Kuhara et al. | |
| 2005/0175359 A1 | 8/2005 | Tsai | |
| 2005/0205760 A1 | 9/2005 | Griffioen | |
| 2005/0213995 A1* | 9/2005 | Lee et al. | 398/208 |
| 2006/0067698 A1 | 3/2006 | Chan et al. | |
| 2006/0244526 A1 | 11/2006 | Mijuskovic | |
| 2007/0086791 A1* | 4/2007 | Noya et al. | 398/202 |

(Continued)

OTHER PUBLICATIONS

Pearson, Jonathan, "Adjustable Cable Equalizer Combines Wideband Differential Receiver with Analog Switches", Analog Dialogue 38-07, Jul. 2004, pp. 1-4.

(Continued)

*Primary Examiner* — Hanh Phan

(57) ABSTRACT

An optical receiver includes a light receiving element for converting an optical signal to an electrical signal having a first bandwidth and an amplifier for amplifying the electrical signal. The amplifier has a first gain response that yields a second bandwidth that is less than the first bandwidth. The optical receiver also includes an equalizing circuit operationally coupled to the amplifier. The equalizing circuit has a second gain response that compensates for the first gain response of the amplifier so that a substantially constant net gain is imparted by the amplifier and the equalizing circuit to the electrical signal over the first bandwidth.

19 Claims, 6 Drawing Sheets

U.S. PATENT DOCUMENTS

| | | |
|---|---|---|
| 2007/0177883 A1 | 8/2007 | Kagaya et al. |
| 2007/0177884 A1 | 8/2007 | Kagaya et al. |
| 2007/0258722 A1 | 11/2007 | Yu |
| 2008/0205897 A1* | 8/2008 | Neenan et al. ............... 398/136 |
| 2009/0103927 A1* | 4/2009 | Cunningham et al. ........ 398/139 |

OTHER PUBLICATIONS

PCT Search Report and Written Opinion, Re: Application #PCT/US09/47439 Aug. 7, 2009.

* cited by examiner

US 8,139,957 B2

HIGH SENSITIVITY OPTICAL RECEIVER EMPLOYING A HIGH GAIN AMPLIFIER AND AN EQUALIZING CIRCUIT

FIELD OF THE INVENTION

The present invention relates generally to optical receivers, and more particularly to an optical receiver with increased sensitivity that employs a PIN photodiode.

BACKGROUND OF THE INVENTION

An optical receiver in which a photodetector serves as a receiver element is one of the key element in an optical fiber transmission network. Optical receivers, in general, function to convert optical signals into electrical signals. A typical optical receiver includes a photodetector connected to the input of an amplifier (e.g., a transimpedance amplifier). The photodetector converts the optical signal it receives into an electric current that is supplied to the amplifier. The amplifier then generates at its output a voltage or current that is proportional to the electric current. The photodetector is typically either an avalanche photodiode (APD) or a PIN (p-intrinsic-n) photodiode. With the recent spread of broadband networks, optical receivers (and optical transmitters) have increased in speed, typically increasing in bit rate from 622 M bps to 2.5 Gbps. More recently still, bit rates up to 10 Gbps are beginning to be widely used.

The sensitivity of optical receiver generally needs to remain constant as the bit rate increases so that the network does not need to be reconfigured for the higher bit rates. For example, optical receiver detectivity for bit rates of 622 Mbps and 1.25 Gbps using a PIN diode is about −32 dBm and −29 dBm, respectively. In addition, optical receiver detectivity for bit rates of 2.5 Gbps is about −26 dBm using a PIN diode and about −32 dBm using an APD. As many systems at 1.25 Gbps are upgraded to 2.5 Gbps, one concern is the weak sensitivity of the optical receiver at 2.5 Gbps. To enhance receiver sensitivity APDs are often preferred because of their superior power sensitivity in comparison to PIN photodiodes. Unfortunately, APDs are generally more costly and less reliable than PIN photodiodes. In addition, APDs can be more difficult to tune and calibrate, in part because its avalanche multiplication factor varies with ambient temperature.

Accordingly, it would be desirable to provide an optical receiver that employs a PIN photodiode but which has an enhanced sensitivity suitable for use in higher speed networks such as those operating at 2.5 and 10 Gbps, for example.

SUMMARY OF THE INVENTION

In accordance with the present invention, an optical receiver is provided. The optical receiver includes a light receiving element for converting an optical signal to an electrical signal having a first bandwidth and an amplifier for amplifying the electrical signal. The amplifier has a first gain response that yields a second bandwidth that is less than the first bandwidth. The optical receiver also includes an equalizing circuit operationally coupled to the amplifier. The equalizing circuit has a second gain response that compensates for the first gain response of the amplifier so that a substantially constant net gain is imparted by the amplifier and the equalizing circuit to the electrical signal over the first bandwidth. In accordance with one aspect of the invention, the light receiving element may be a PIN photodiode.

In accordance with another aspect of the invention, the amplifier may be a transimpedance amplifier (TIA).

In accordance with another aspect of the invention, the first bandwidth may correspond to a signal bit rate of 2.5 Gbps and the second bandwidth may correspond to a signal bit rate of 1.25 Gbps.

In accordance with another aspect of the invention, the second gain response may have a frequency dependency that complements a frequency dependency of the first gain response.

In accordance with another aspect of the invention, a forward error correction unit may be operationally coupled to receive an output signal from the equalizing circuit.

In accordance with another aspect of the invention, the equalizing circuit may include a pair of high impedance transconductance amplifiers arranged to produce output currents that are summed together.

In accordance with another aspect of the invention, the equalizing circuit may have a transfer function that is reciprocal to a pole-zero transfer function of the amplifier.

In accordance with another aspect of the invention, a method is provided for converting an optical signal to an electrical signal. The method includes detecting an optical signal, converting the optical signal to an electrical signal, and imparting gain to the electrical signal. The gain is imparted to the electrical signal with an amplifier having a selected gain level greater than that for which its gain-bandwidth product yields a bandwidth sufficient to amplify the electrical signal across its complete frequency band at the selected gain level. The gain imparted to the electrical signal is equalized so that it is amplified across its complete frequency band at the selected gain level.

DETAILED DESCRIPTION

Figure 1:
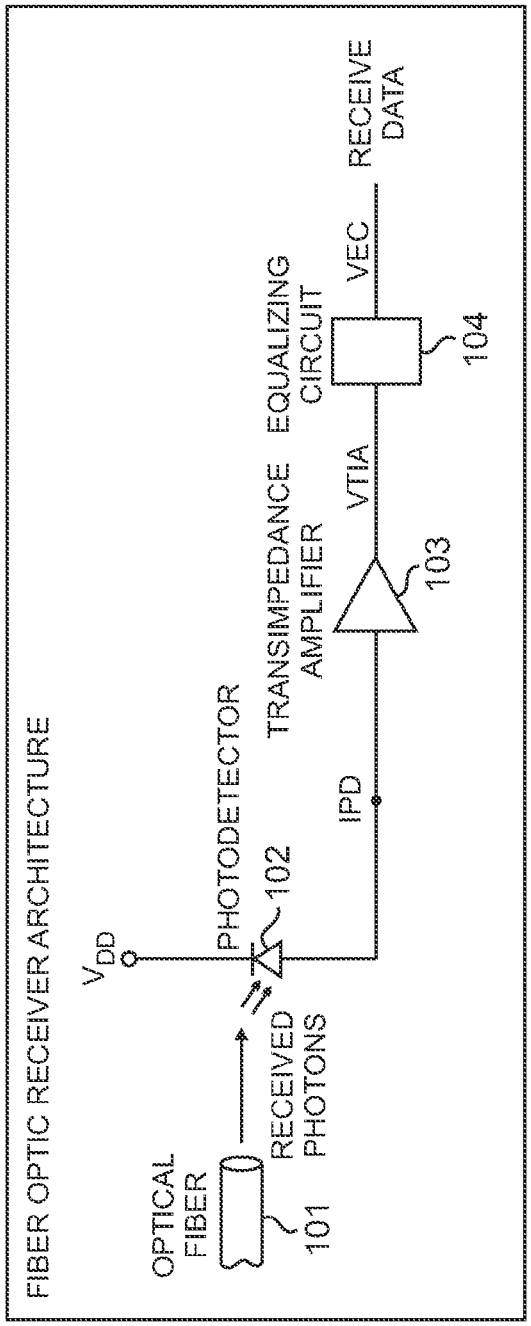
FIG. 1 is a schematic block diagram of one example of an optical receiver constructed in accordance with the methods and techniques described herein.

FIG. 1 is a schematic block diagram of an optical receiver constructed in accordance with the methods and techniques described herein. The light from an optical fiber 101 impinges on a PIN photodiode detector 102, producing a current IPD. Transimpedance amplifier (TIA) 103 converts the relatively small current generated by the photodiode detector into a large signal voltage, VTIA, which is further processed by equalizing circuit 104 to produce a voltage VEC for output to digital circuitry (not shown).

Figure 2:
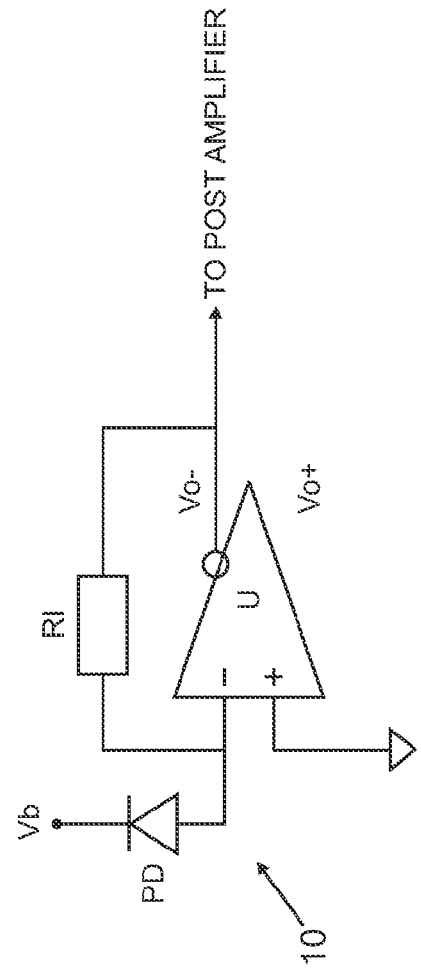
FIG. 2 shows a simplified example of a transimpedance amplifier (TIA) for the purpose of illustrating the relationship between the bandwidth and gain.

Two important operating characteristics of the transimpedance amplifier 103 are its transimpedance gain and its bandwidth. A relatively simple illustrative transimpedance amplifier is shown in FIG. 2. The transimpedance amplifier 10 includes a high-speed operational amplifier U having plus (+) and minus (−) inputs and differential outputs labeled Vo− and Vo+. The photodetector PD (e.g., PIN photodiode 102) is connected between a bias voltage source Vb and the minus (−) input of the operational amplifier U. The plus (+) input of the operational amplifier U is connected to ground. The negative output Vo− comprises a voltage output to a post processing amplifier, which comprises a common voltage amplifier. A feedback resistor Rf is connected between the minus output Vo− and the minus (−) input. The bandwidth of the transimpedance amplifier circuit 10 is defined by $$BW=1/(2\pi*Rf*Cin*A)$$

where Cin is the input capacitance, including the amplifier input capacitance and the parasitic capacitance of the photodetector PD, and A is the open loop gain of the operational amplifier U. This expression for the bandwidth represents an instance of the well-known inverse relationship between amplifier gain and bandwidth. This relationship can be more precisely expressed by stating that the product of the closed loop gain and the cut-off frequency of an amplifier is a constant, which is referred to as the gain-bandwidth product of the amplifier.

As previously mentioned, an optical receiver of the type shown in FIG. 1 which uses a PIN photodiode instead of an APD will often fail to meet sensitivity requirements, particularly for bit rates of 2.5 Gbps and above. Compensating for the reduced sensitivity on the part of the PIN photodiode by increasing the gain of the TIA 103 will not adequately address this problem because as a result of increasing the gain, the bandwidth of the TIA 103 will be less than that required for accommodating a signal with a bit rate of 2.5 Gbps or more.

Figure 3:
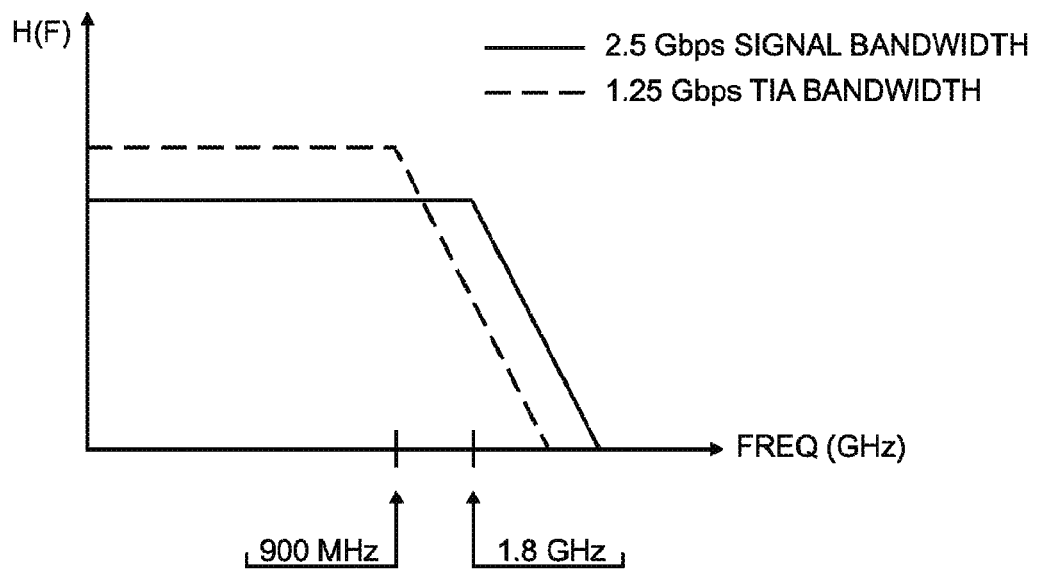
FIG. 3 shows the gain versus frequency for a 2.5 Gbps signal when the TIA that is employed is sufficient to accommodate the full 1.8 GHz bandwidth of the 2.5 Gbps signal and when a TIA is used with a bandwidth of 900 MHz, which can only accommodate a 1.25 Gbps signal.

FIG. 3 shows the gain that can be achieved for a 2.5 Gbps signal when the TIA that is employed is sufficient to accommodate the full 1.8 GHz bandwidth of the 2.5 Gbps signal. Also shown in FIG. 3 is the increased gain that can be achieved, but at the expense of a reduction in the bandwidth of the TIA. In this case the bandwidth of the TIA is reduced to 900 MHz, which is sufficient to accommodate a 1.25 Gbps signal but not a 2.5 Gbps signal.

Despite the reduced bandwidth, the higher gain TIA may be used to amplify the 2.5 Gbps signal by further employing the equalizing circuit 104 shown in FIG. 1. The equalizing circuit, which is located downstream from the TIA 103, has a frequency-dependent gain response that is complementary to the frequency-dependent gain response of the TIA 103.

Equalizing circuits such as equalizing circuit 104 are conventionally employed to compensate for losses imposed on a signal as it travels through a transmission medium such as a cable. That is, an equalizing circuit serves to neutralize a cable's frequency dependency. For this reason equalizing circuits are sometimes also referred to as cable or backplane equalizers. Such transmission medium losses are typically greatest at higher frequencies.

Figure 4:
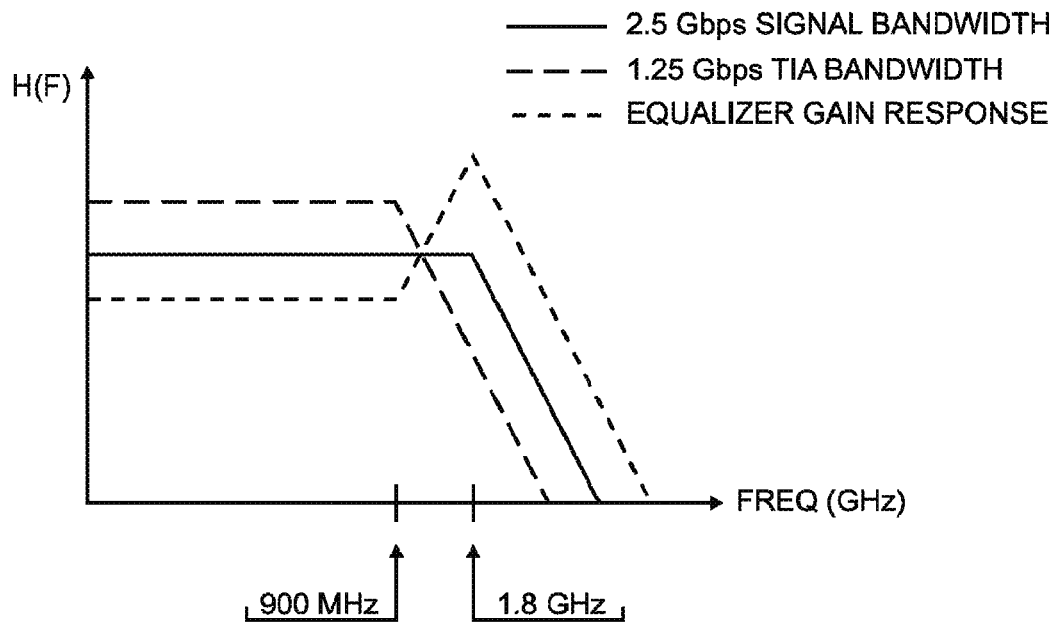
FIG. 4 shows the gain versus frequency graph of FIG. 3 on which is superimposed the frequency-dependent gain response of the equalizing circuit employed in the optical receiver depicted in FIG. 1.

Instead of using an equalizing circuit to compensate for transmission medium losses, in the present context an equalizing circuit is used to compensate for the limited bandwidth of the TIA. As in FIG. 3, FIG. 4 once again shows the gain of 2.5 Gbps signal when a TIA is used with a bandwidth that can accommodate the full 1.8 GHZ bandwidth of the signal and when a TIA is used with a bandwidth of 900 MHz, which can only accommodate a 1.25 Gbps signal. Also shown in FIG. 4 is the gain response of the equalizing circuit 104. As the figure indicates, the non-linear gain response of the equalizing circuit 104 compensates for the limited bandwidth of the higher gain TIA so that all the frequencies in the 2.5 Gbps signal are equally amplified.

The use of an equalizing circuit in an optical circuit allows a TIA to be used with an increased gain by sacrificing bandwidth in accordance with its gain-bandwidth product. Frequency dependent distortions that are imparted to the signal by the amplifier are effectively repaired by the equalizing circuit. The TIA will set the SNR and as you increase the gain Z the noise only goes up as the root of the gain Z because the thermal noise of the feedback resistor does not see the gain of the amplifier. In addition, the signal to noise ratio (SNR) of the arrangement will be determined by the TIA since the use of the equalizing circuit not change the input referred current noise density.

Figure 5:
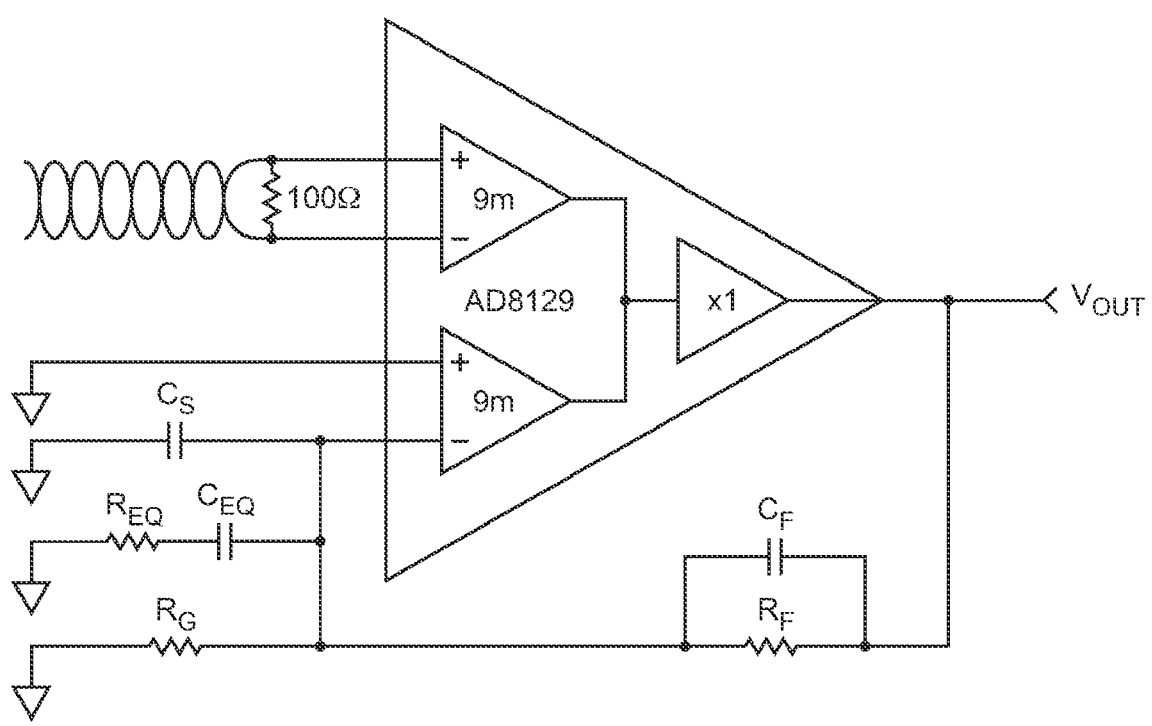
FIG. 5 shows one example of an equalizing circuit that may be employed in an optical receiver such as the optical receiver depicted in FIG. 1.
Figure 8:
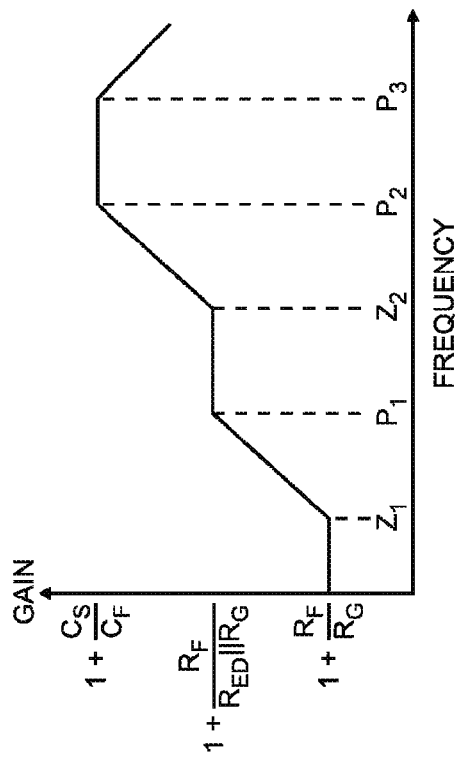
FIG. 8 shows the relationship between the poles and zeros and the overall frequency dependent response of the negative feedback circuit employed in the equalizing circuit depicted in FIG. 5.

One example of an equalizing circuit is shown in FIG. 5. The equalizing circuit has a transfer function that is the reciprocal of the TIA's pole-zero transfer function. The circuit includes two high impedance trans-conductance amplifiers. The output currents of the transimpedance amplifiers are summed and buffered out. A negative feedback circuit contains frequency dependent elements that control the frequency dependent gain of the overall circuit. The relationship between the poles and zeros of the negative feedback circuit as well as its overall frequency dependent response is shown in FIG. 8

Figure 6:
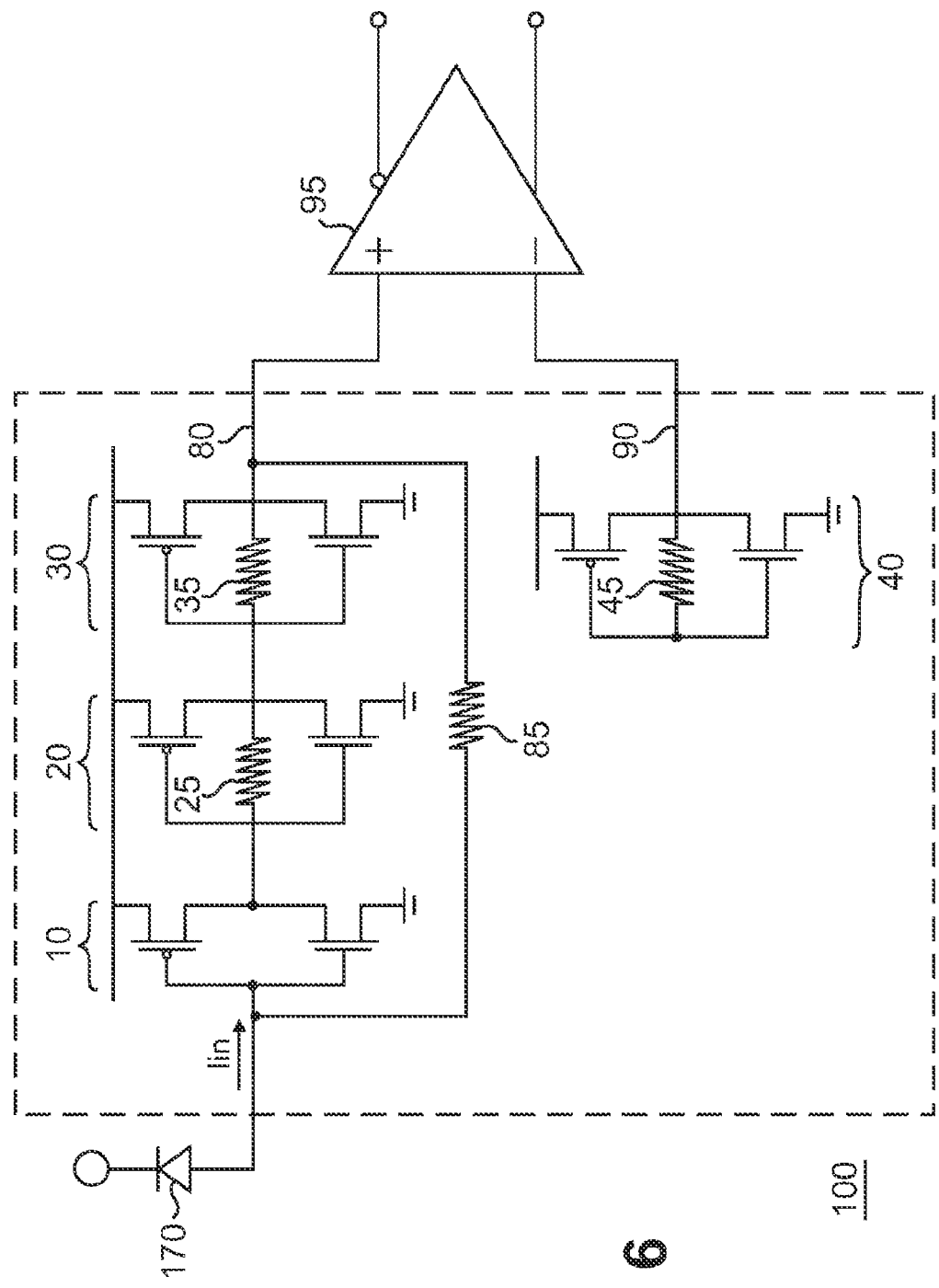
FIG. 6 shows one example of a TIA that is suitable for use in a high bit rate (e.g., 2.5 Gbps) optical receiver.

FIG. 6 shows one example of a TIA 100 that is suitable for use in a 2.5 Gbps optical receiver. The TIA is a multi-stage amplifier that may be implemented in any suitable process technology such as CMOS, bipolar or GaAs MESFET technologies, for example. Three gain stages 10, 20, 30 are cascaded in the TIA 100. Of course, additional or fewer gain stages may be employed. The input current, Iin, generated by the photodetector 170, is fed to the input of the first gain stage 10, the output of which is the input of the second gain stage 20. A first passive feedback element 25 is applied around the second gain stage 20, which lowers the output impedance of the TIA 100. The first passive feedback element 25 may be implemented by a resistor, which can be realized by, for example, an n-channel device or an n-channel device coupled in parallel with a capacitor. By adding a second passive feedback element 35 around the third gain stage 30, the output impedance of the TIA 100 may be further lowered. This further improves the stability of the TIA 100. As a result of the local degeneration provided by the first passive feedback element 25 and the second passive feedback element 35, output impedance may be lowered and the stability of the TIA 100 may be improved. Furthermore, a general feedback element 85 may be coupled in parallel with the first gain stage 10, the second gain stage 20, and the third gain stage 30 to further improve the stability of the TIA 100.

A differential output is generated by using a replica biasing stage 40 having a DC point that tracks the DC point of the TIA 100. The replica biasing stage 40 is self-biased, with a replica feedback element 45 positioned across an input and an output of the replica biasing stage 40. In this fashion, the replica biasing stage 40 acts as a bias generator. The first input of a differential amplifier 95 may receive the first output 80 from the three gain stages 10, 20, 30. A second input of the differential amplifier 95 may receive a second output 90 from the replica biasing stage 40. The differential amplifier 95 may act as an output buffer that provides the output signal VTIA of FIG. 1. Automatic gain control (AGC) may be added to the TIA of FIG. 6 by applying a degenerative feed-forward element around the first gain stage 10. The degenerative feedforward element can be controlled by the output of an operational amplifier.

Figure 7:
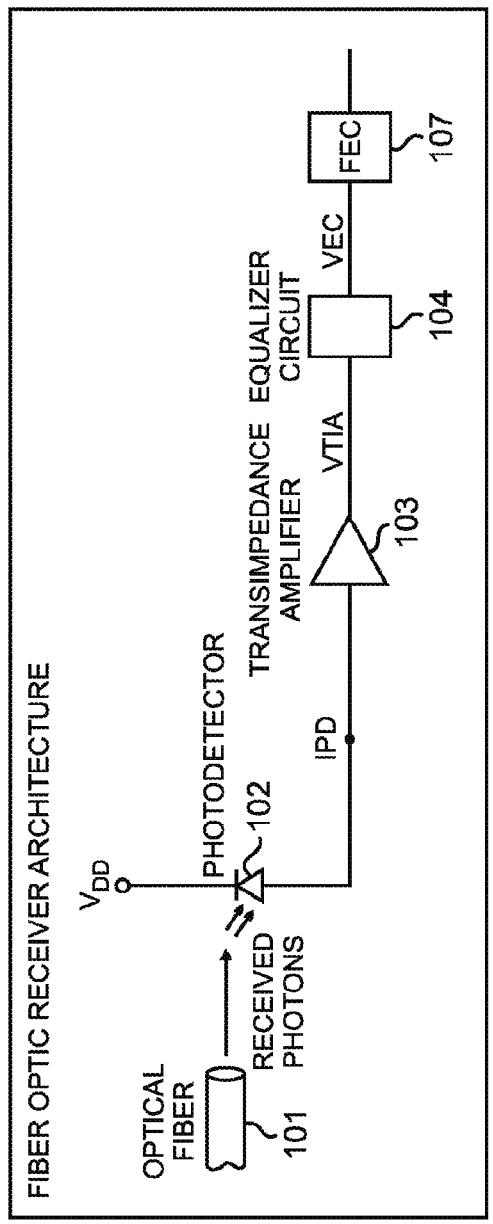
FIG. 7 is a schematic block diagram of another example of an optical receiver constructed in accordance with the methods and techniques described herein.

In some implementations it may be desirable to locate a forward error correction (FEC) unit 107 at the output of the equalizing circuit, as shown in FIG. 7. The FEC unit 107 can be used to further enhance the sensitivity of the optical receiver by recovering from errors using additional data located in the data stream that is received by the optical receiver. In FIGS. 1 and 7 like elements are denoted by like reference numerals.

Figure 9:
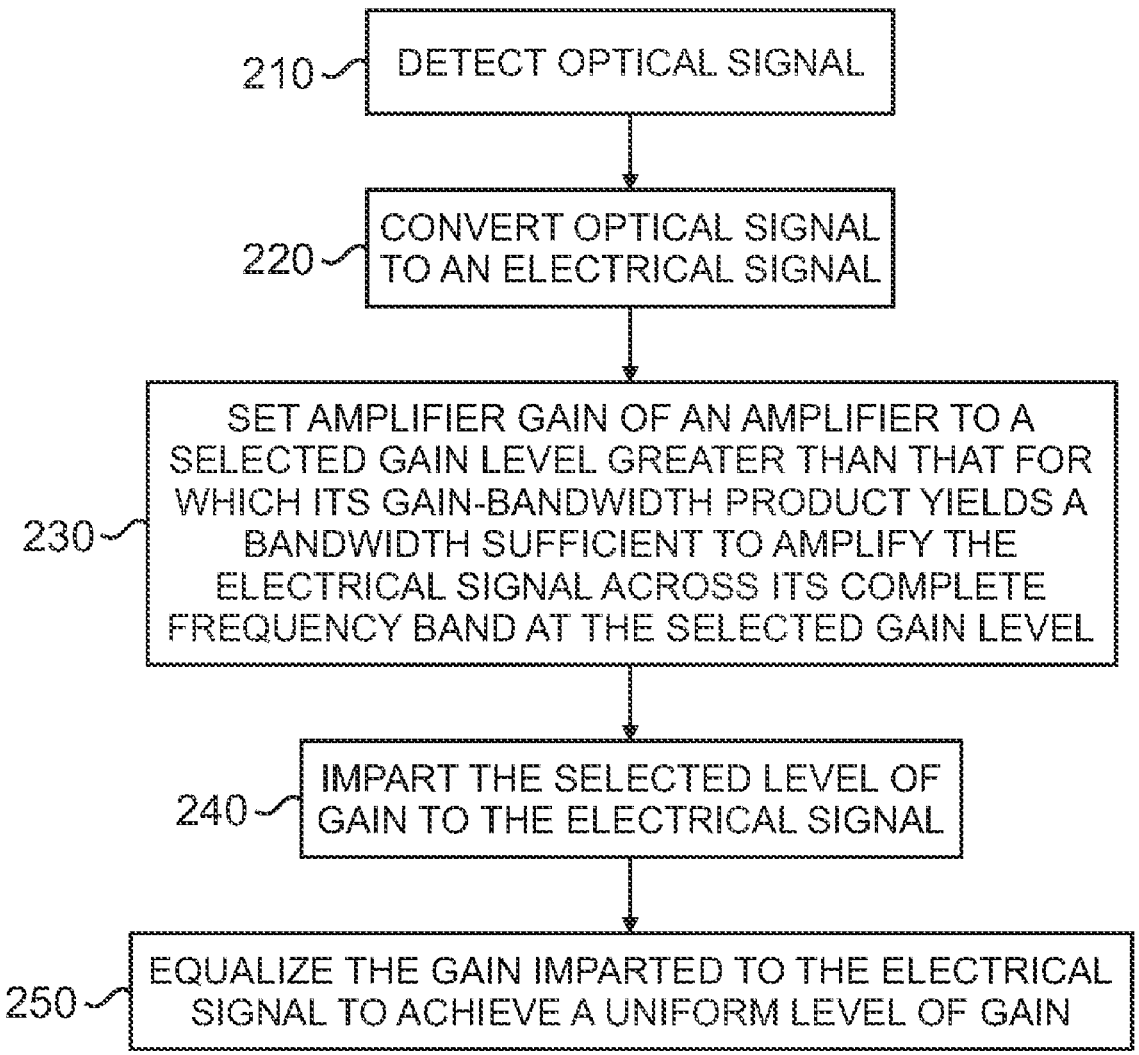
FIG. 9 shows one example of a method by which an optical receiver converts an optical signal to an electrical signal.

FIG. 9 shows one example of a method by which an optical receiver converts an optical signal to an electrical signal. The method begins by detecting an optical signal in step 210. The optical signal is converted to an electrical signal in step 220. In step 230 the gain of an amplifier such as a TIA is set to a selected gain level greater than that for which its gain-bandwidth product yields a bandwidth sufficient to amplify the electrical signal across its complete frequency band at the selected gain level. In step 240, the selected level of gain is imparted to the electrical signal by the amplifier. The gain imparted to the electrical signal is then equalized in step 250 so that the electrical signal is amplified across its complete frequency band with a uniform level of gain.

A method and apparatus have been described for receiving and converting an optical signal to an electrical signal. By using an equalizing circuit in conjunction with an amplifier, the sensitivity of the apparatus is increased by using an amplifier gain level that is higher than would otherwise be possible if the equalizing circuit were not employed. In this way a PIN photodiode may be used in optical receivers designed for use in higher speed networks such as those operating at 2.5 and 10 Gbps, for example.

The invention claimed is:

1. An optical receiver, comprising:
    a light receiving element for converting an optical signal to an electrical signal having a first bandwidth;
    an amplifier for amplifying the electrical signal, said amplifier having a first gain response that yields a second bandwidth that is less than the first bandwidth; and
    an equalizing circuit operationally coupled to the amplifier, said equalizing circuit having a second gain response that compensates for the first gain response of the amplifier so that a substantially constant net gain is imparted by the amplifier and the equalizing circuit to the electrical signal over the first bandwidth, wherein the equalizing circuit includes a pair of high impedance transconductance amplifiers arranged to produce output currents that are summed together.

2. The optical receiver of claim 1 wherein the light receiving element is a PIN photodiode.

3. The optical receiver of claim 1 wherein the amplifier is a transimpedance amplifier (TIA).

4. The optical receiver of claim 1 wherein the first bandwidth corresponds to a signal bit rate of 2.5 Gbps and the second bandwidth corresponds to a signal bit rate of 1.25 Gbps.

5. The optical receiver of claim 1 wherein the second gain response has a frequency dependency that complements a frequency dependency of the first gain response.

6. The optical receiver of claim 1 further comprising a forward error correction unit operationally coupled to receive an output signal from the equalizing circuit.

7. The optical receiver of claim 1 wherein the equalizing circuit has a transfer function that is reciprocal to a pole-zero transfer function of the amplifier.

8. A method of converting an optical signal to an electrical signal, comprising:
    detecting an optical signal;
    converting the optical signal to an electrical signal;
    imparting gain to the electrical signal with an amplifier having a selected gain level greater than that for which its gain-bandwidth product yields a bandwidth sufficient to amplify the electrical signal across its complete frequency band at the selected gain level; and
    equalizing the gain imparted to the electrical signal so that it is uniformly amplified across its complete frequency band at the selected gain level by using an equalizing circuit operationally coupled to the amplifier, the equalizing circuit having a frequency-dependent gain response that reduces the frequency-dependent distortions imparted to the electrical signal and including a pair of high impedance transconductance amplifiers arranged to produce output currents that are summed together.

9. The method of claim 8 wherein imparting gain includes transforming a signal current of the electrical signal to a signal voltage.

10. The method of claim 8 wherein the bandwidth of the amplifier corresponds to a signal bit rate of 1.25 Gbps and the complete frequency band of the electric signal corresponds to a signal bit rate of 2.5 Gbps.

11. The method of claim 8 wherein the gain is equalized by an equalizing circuit that has a transfer function that is reciprocal to a pole-zero transfer function of the amplifier.

12. An optical receiver, comprising:
    a light receiving element for converting an optical signal to an electrical signal having a first bandwidth;
    an amplifier for amplifying the electrical signal while imparting frequency-dependent distortions thereto; and
    an equalizing circuit operationally coupled to the amplifier, said equalizing circuit having a frequency-dependent gain response that reduces the frequency-dependent distortions imparted to the electrical signal, wherein the equalizing circuit includes a pair of high impedance transconductance amplifiers arranged to produce output currents that are summed together.

13. The optical receiver of claim 12 wherein the frequency-dependent gain response of the equalizing circuit compensates for a gain response of the amplifier so that a substantially constant net gain is imparted by the amplifier and the equalizing circuit to the electrical signal.

14. The optical receiver of claim 12 wherein the light receiving element is a PIN photodiode.

15. The optical receiver of claim 14 wherein the amplifier is a transimpedance amplifier (TIA).

16. The optical receiver of claim 15 wherein the TIA has a bandwidth of 900 MHz.

17. The optical receiver of claim 16 wherein the frequency-dependent gain response of the equalizing circuit reduces the frequency-dependent distortions imparted to the electrical signal between 900 MHz and 1.8 GHz.

18. The optical receiver of claim 14 further comprising a forward error correction unit operationally coupled to receive an output signal from the equalizing circuit.

19. The optical receiver of claim 12 wherein equalizing circuit has a transfer function that is reciprocal to a pole-zero transfer function of the amplifier.

\* \* \* \* \*